United States Patent [19]
Yamaguchi et al.

[11] Patent Number: 4,700,136
[45] Date of Patent: Oct. 13, 1987

[54] NMR IMAGING APPARATUS

[75] Inventors: Keiki Yamaguchi; Hideto Iwaoka; Tadashi Sugiyama; Yuji Inoue, all of Tokyo, Japan

[73] Assignees: Yokogawa Electric Corporation; Yokogawa Medical Systems, Limited, both of Tokyo, Japan

[21] Appl. No.: 796,603

[22] Filed: Nov. 8, 1985

[30] Foreign Application Priority Data

Nov. 13, 1984 [JP] Japan ............................ 59-172130[U]

[51] Int. Cl.⁴ ............................................ G01R 33/22
[52] U.S. Cl. ...................................... 324/309; 324/320
[58] Field of Search ....................... 324/309, 320, 318; 364/414

[56] References Cited

U.S. PATENT DOCUMENTS 4,585,992  4/1986  Maudsley et al. ............. 324/320 X
4,623,844  11/1986  Macouski ............................ 324/320

Primary Examiner—Tom Noland
Attorney, Agent, or Firm—Moonray Kojima

[57] ABSTRACT

An NMR imaging domain is required to have a uniform distribution of static magnetic field. However, it is very difficult to generate a uniform magnetic field for an entire imaging domain, which is usually a spherical domain. The invention advantageously, exploits the requirement that to obtain imaging the static magnetic field need only be uniform as the slicing part. Thus, sufficient uniformity of static magnetic field is obtained in the invention by providing one or more shim coils to a static magnetic field generating coil and selectively controlling current to be applied to each shim coil in relation to data defining the imaging domain.

4 Claims, 13 Drawing Figures

ZX Plane

YZ Plane

XY Plane

ZX Plane

Sphere

Round Bar

NMR IMAGING APPARATUS

BACKGROUND OF THE INVENTION

1. Field of Invention

This invention relates to a nuclear magnetic resonance (hereinafter called "NMR") imaging apparatus which is capable of detecting a particular atomic nucleus distribution in a specimen to be inspected from the outside thereof by using NMR; and more particlarly, to improvements in means for distributing magnetic field of the main magnetic field.

2. Description of Prior Art

In an NMR imaging apparatus, a living body, e.g. a human patient, is placed under a magnetic field. A predetermined pulsewise electromagnetic wave is applied to the body in order to excite only the particular atomic nucleus, which is considered to be an object, in the various atoms which form the body. The atomic nucleus, once excited, recovers again to the initial energy state. At this time, the absorbed energy is also emitted to the outside as an electromagnetic wave. The NMR imaging apparatus detects such emitted magnetic field with a coil. This detected signal is called an NMR signal and includes various kinds of information about the object atomic nucleus. The NMR imaging apparatus analyzes such information and visualizes the detected part of the body as a tomographic image. The tomographic image is helpful in diagnosis and analysis of the body.

Such NMR imaging apparatus is required, from the standpoint of its application purposes, to obtain a high quality image. Uniformity in magnetic field distribution is a major factor for determining the quality of the image. Thus, enhancement of uniformity of magnetic field distribution in the area where a specimen (which is the diagnostic object) is placed, results in improvement of the quality of the image.

The area of uniform domain of magnetic field required for the actual NMR imaging apparatus is as follows. For example, when a specimen is scanned in a plane, such as shown in FIG. 2, the uniform domain required for obtaining tomographic images of the abdomen or the breast is 350 mm in diameter and 200 mm in diameter at the head.

In addition, it is a characteristic of the NMR imaging apparatus to obtain tomographic images of the specimen in desired directions. Accordingly, to insure attainment of such characteristics, it has been considered necessary to generate a domain having uniform magnetic field directed to the entire part of a sphere or round bar having a diameter of 350 mm, as shown in FIG. 3. However, disadvantageously, acquisition of such a wide uniform domain requires static magnetic field coils which are extremely accurate. Also, to maintain such accuracy compels constant adjustment, such as fine adjustment of the static magnetic field coils or adjustment of the values of current applied to the shim coils. Thus, manufacturing and maintenance costs are substantial and leave much to be desired. These disadvantages and deficiencies of the prior art are major problems which limit the practical use of NMR imaging apparatus.

SUMMARY OF THE INVENTION

Accordingly, an object of the invention is to overcome the aforementioned and other deficiencies and disadvantages of the prior art.

Another object is to provide an NMR imaging apparatus which generates an image domain having thereat sufficiently highly uniform magnetic field distribution to obtain high quality images.

In contrast to the prior art, where uniform magnetic field is generated and directed to the entire part of a constant volume, the invention generates and directs a sufficiently uniform magnetic field to the slicing surface (which is smaller than the conventional area) of an image tb be obtained. For diagnostic operation, it is sufficient to direct the uniform magnetic field only at a small are a and such uniform magnetic field which is direct to a small area can be generated more easily than the prior art where the uniform magnetic field must be directed to the entire part of the volume detected The foregoing and other objects are attained by the invention which comprises an NMR imaging apparatus comprising a static magnetic field coil for generating a static magnetic field, a plurality of shim coils which compensate for the distribution of magnetic field generated by such a static magnetic field coil; a power supply which supplies power to the respective shim coils; a memory means which previously stores values of current to be applied to the shim coils to produce sufficient uniformity of static magnetic field at the predetermined imaging domain and which stores values of current to be applied to the shim coils; and a computer which receives data defining the imaging domain and controls current to be applied to the shim coils by selecting suitable current values from the memory means.

DESCRIPTION OF PREFERRED EMBODIMENTS

Figure 1:
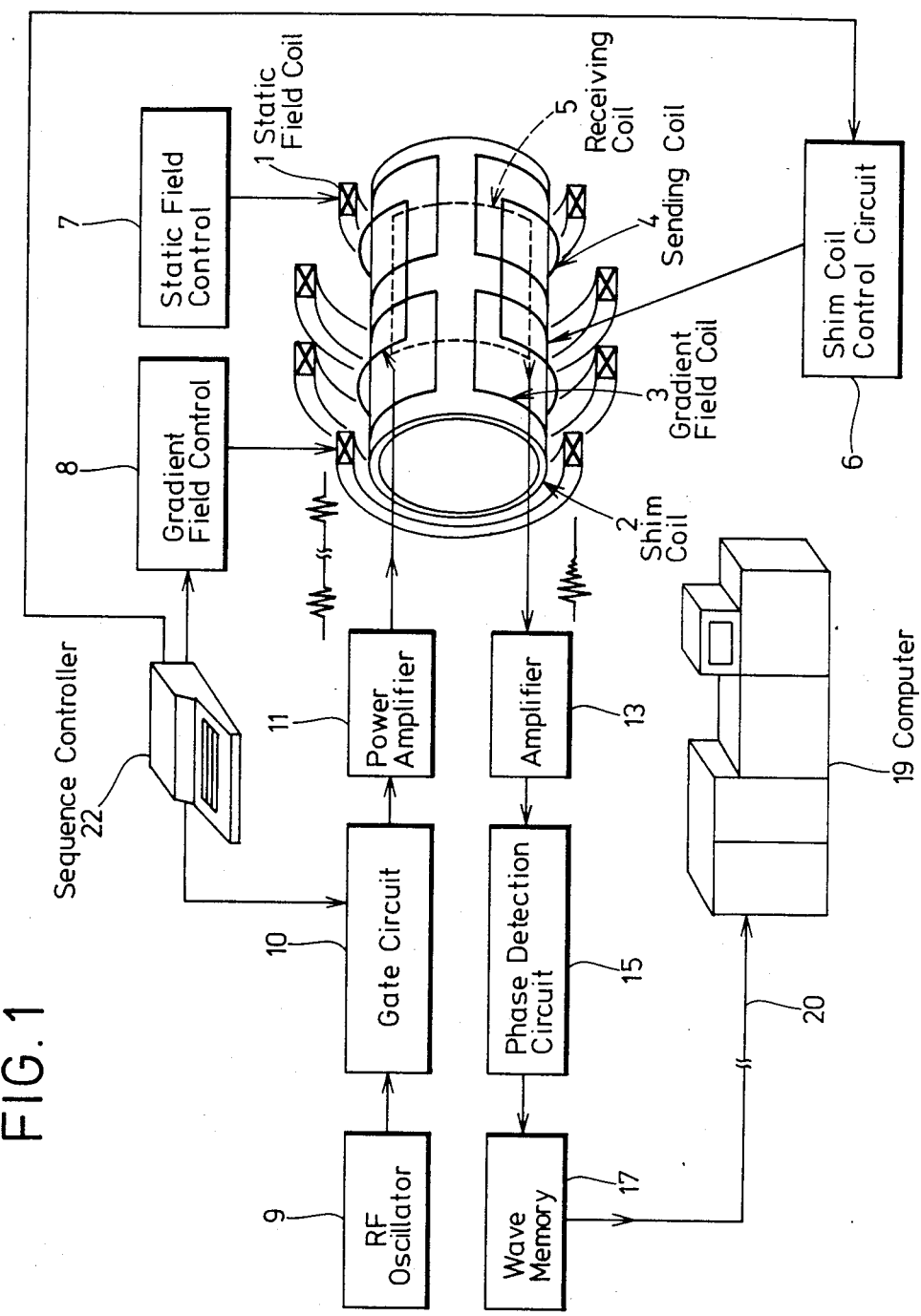
FIG. 1 depicts an illustrative embodiment of the invention.
Figure 2:
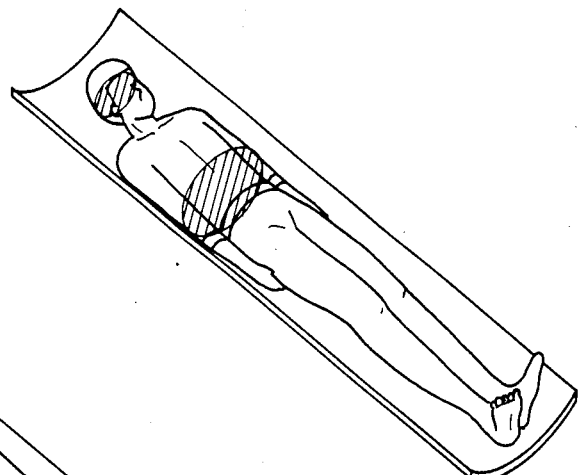
FIGS. 2 and 3 depict areas of imaging domain in a scanned specimen.
Figure 3:
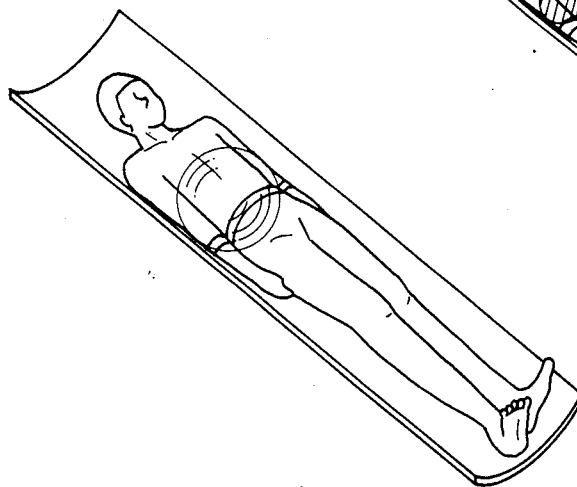

FIG. 1 depicts an illustrative embodiment of the invention, wherein a static magnetic field coil 1 is used to generate a uniform static magnetic field $H_o$ (direction Z, in this case). In general, static field coil 1 comprises 4 pieces. It is impossible to attain the uniform field distribution (uniformity of $10^{-4}$ or more is desirable) required for obtaining high quality imaging using only such static field coil 1. Thus, shim coils 2 are used together with the static field coil 1 to compensate for static field distribution obtained by the coil 1, to attain the desired uniformity.

Figure 4I:
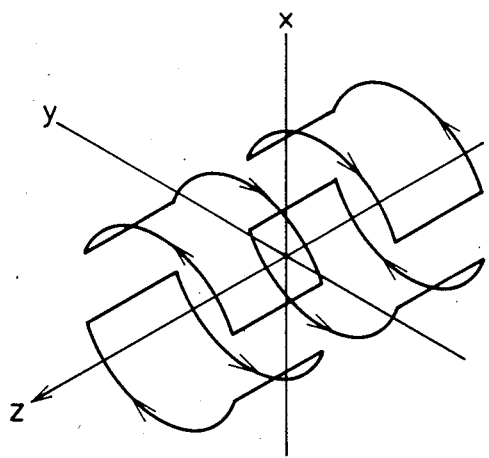
FIGS.4(i) and 4(ii) depict examples of general shapes of shim coils.
Figure 4:
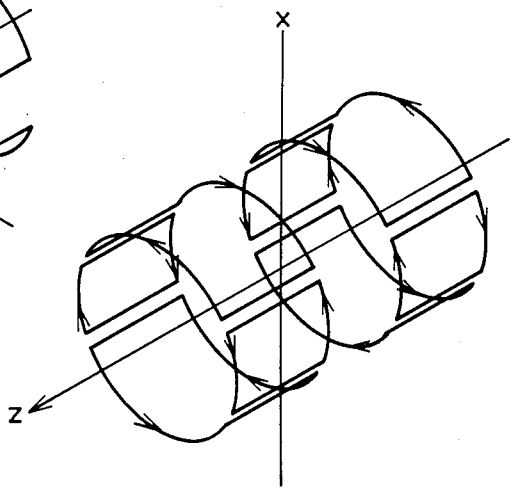

FIGS. 4(i) and 4(ii) show general shapes of shim coils 2. The main manetic field (static magnetic field) which is compensated is oriented in the Z axis direction. An arrow mark indicates the direction of the current flow. FIG. 4(i) indicates the shim coil used for generating a magnetic field distribution in the form of $Hz(x,y,z)=X$ for the field in the Z axis direction. FIG. 4(ii) indicates the shim coil used for generating a magnetic field distribution in the form of $Hz(x,y,z)=X^2-Y^2$. The amount of compensation obtained, for fields generated by these shim coils, can be determined by certain values of currents applied to the coils. Shim coil 2 is usually arranged inside of static field coils 1, such as depicted in FIG. 1, but may also be provided outside thereof. In general, an NMR imaging apparatus provides a plurality (about 10 or more) of shim coils having the shapes shown in FIGS. 4(i) and 4(ii), and compensation of the main magnetic field can be realized by combining the two respective coils, where desired.

Returning to FIG. 1, inside coil 1 is gradient field coil 3, a sending coil 4 and a receiving coil 5. Gradient field coil 3 determines, for example, the position of the tomographic image, namely, the position of the slicing surface and also various other roles. Gradient coil 3 is not directly related to the invention and hence a description of its operation is omitted hereat for sake of convenience. Sending coil 4 and receiving coil 5 function to send RF signals and detect the NMR phenomenon, respectively. These coils are also not related to the invention, and hence, their descriptions are omitted hereat for convenience.

Figure 5:
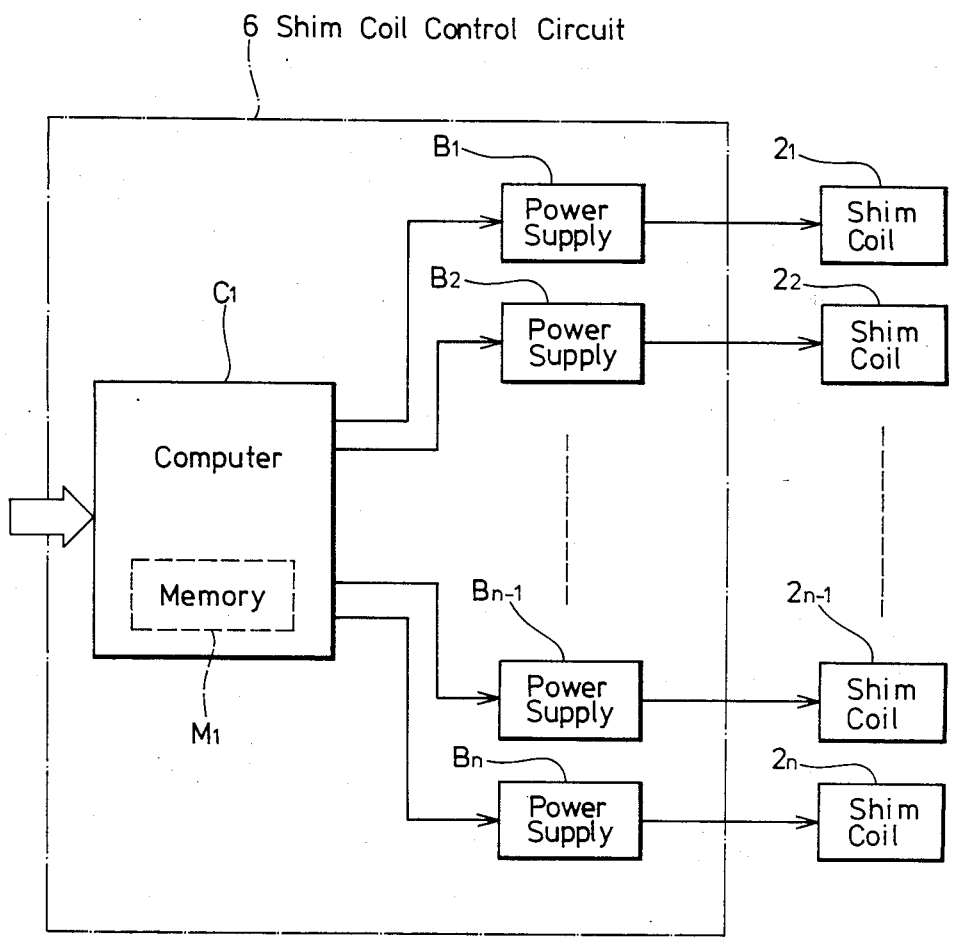
FIG. 5 depicts an exemplary shim coil control circuit and connections to shim coils.

Controlling the shim coils 2 is a shim control circuit 6 which has a signal supplied from sequence controller 22. An exemplary construction of this circuit 6 and connections thereof to shim coils $2_1 \ldots 2_n$ are shown in FIG. 5, wherein the control circuit 6 comprises a computer $C_1$ having a memory $M_1$ therein and power supplied $B_1 \ldots B_n$ connected to shim coils $2_1 \ldots 2_n$. These elements enclosed by the chained line have the principal functions characterized by the invention. The power supplies $B_1 \ldots B_n$ are applied respectively to the shim coils $2_1 \ldots 2_n$. As described hereinbelow, memory $M_1$ stores (1) at a previous time to control of the uniformity of the magnetic field, values of currents to be supplied to the shim coils which result in a sufficiently uniform magnetic field at the predetermined image domain to obtain high quality images, and (2) values of current to be supplied to the shim coils.

Computer $C_1$ selects suitable shim current values from the memory $M_1$ in accordance with data defining the image domain (for example, size of area, plane or volume, direction, location, such as head or abdomen, etc.) and controls the power supplies $B_1 \ldots B_n$ connected to shim coils $2_1 \ldots 2_n$ in order to obtain the optimum uniformity of field distribution at the predetermined image domain (e.g. slicing surface. In this case, data for drift of static field may be included for consideration by the computer. Moreover, a uitable shim coil current may also be selected for considering the data about the specimen, such as whether the object is an adult or child.

In FIG. 5, computer $C_1$ is contained within shim coil control circuit 6, but the functions of the computer may be performed by sequence controller 22, described hereinbelow, or by other elements. In addition, memory $M_1$ may be provided independent of computer $C_1$.

Returning again to FIG. 1, a control circuit 7 controls static field coil 1. It may comprise, for example, a DC regulation power supply. A gradient field control circuit 8 controls the gradient field coil 3, and is controlled by controller 22, which controller 22 also controls or supplies instructions to gate circuit 10 and shim control circuit 6, as depicted. An oscillator 9 generates RF signals of frequencies (e.g. 42.6 MHz/T, in the case of protons) corresponding to the NMR condition of the atomic nucleus to be measured. The output of oscillator 9 is applied to a gate circuit 10, which is controlled in the ON and OFF states by signals sent from sequence controller 22 thereby to transmit signals to a sending coil 4 through a power amplifier 11.

An amplifier 13 amplifies an NMR signal (namely, FID signal or echo signal) obtained from receiving coil 5 and supplies an amplified signal to a phase detection circuit 15 and then to a wave memory 17 which includes an A/D converter which stores detected waveform signals sent from amplifier 13. A computer 19 receives signals from wave memory circuit 17 through transmission path 20 and reconstitutes a tomographic image through predetermined signal processing.

Sequence controller 22 is so constituted that it can generate signal required for controlling the intensity of gradient field and generate timing for applying the signal and for controlling the amplitude of the RF pulse (analog signals) and generate control signals required for sending the RF pulse and receiving NMR signal (digital signals). Moreover, as described, sequence controller 22 is capable of controlling the shim coils 2, such as done by computer $C_1$ in FIG. 5.

The operation of the embodiment is described with reference to FIG. 6, wherein the condition of the distribution of the static field is illustrated. The abscissa is the X axis in the space within the cylindrical portion where various coils are arranged. The ordinate indicates the intensity of the field. To assist in understanding of the invention, compensation of a single dimensional field distribution is described as an example.

In case distribution of static field is given as curve 1, this distribution indicates a curve rising at the right side with position $X=0$ considered as the center when focused on the domain $l_2$. Curve 1 indicates that the field intensity is not uniform.

Figure 6:
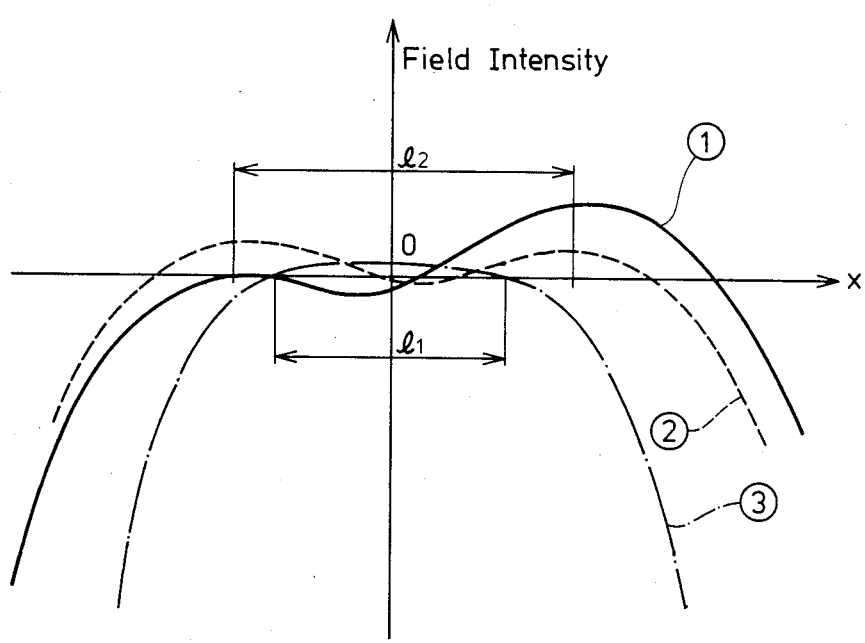
FIG. 6 is a graph depicting the distribution conditions of a static magnetic field and results after compensation.

This characteristic can be compensated so that the curve will be as the curve denoted 2 in the FIG. 6 by using the coil arrangement shown in FIG. 4(i), wherein X shim coil has the intensity proportional to x. Thus, imaging can be realized in the domain $l_2$.

However, to image in domain $l_1$, compensation of the main field can be attained by the use of the coil shown in FIG. 4(ii), wherein $X^2$ shim coil has the intensity proportional to $x^2$, to cause the curve to be as the curve denoted 3 in FIG. 6. In comparison with the characteristic of curve 2, the uniformity is further improved in curve 3.

Figure 7A:
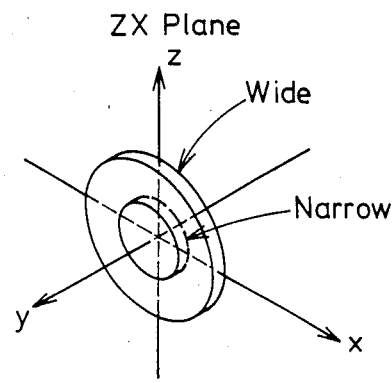
FIGS. 7(a) through 7(f) depict examples of two dimensional and three dimensional imaging domains.
Figure 7B:
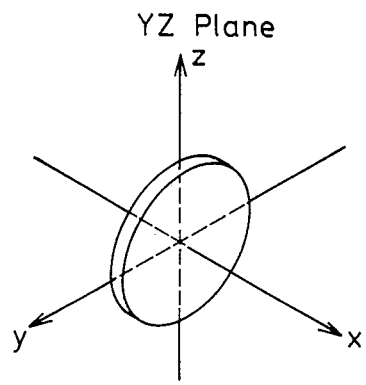
Figure 7C:
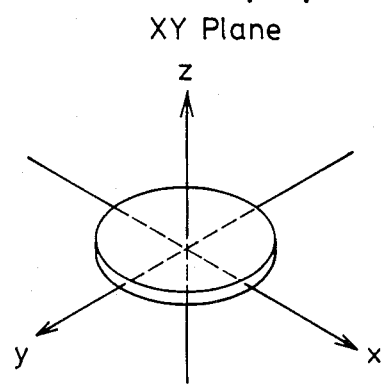
Figure 7D:
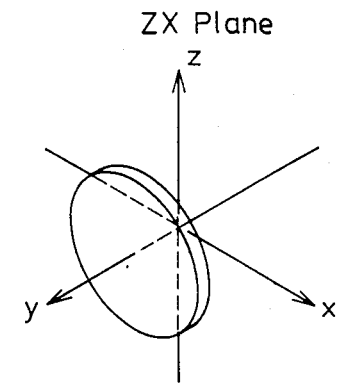
Figure 7E:
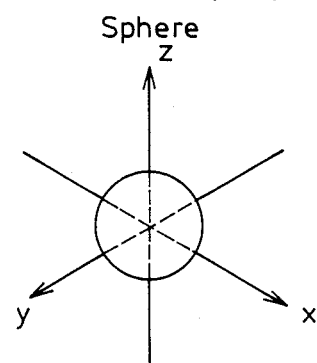
Figure 7F:
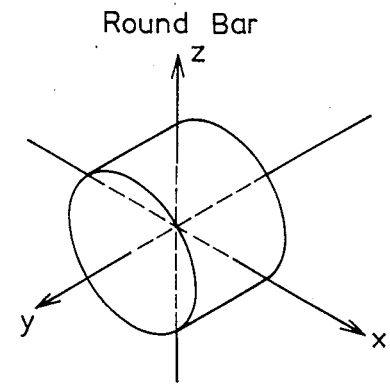

The above description is applicable to a one dimensional distribution. Compensation can be also accomplished in the same way for a plane (two-dimensional distribution) and a solid (three-dimensional distribution). Compensation is described with respect to FIGS. 7(a)-7(f) which show examples of plane imaging domains and solid imaging domains. For example, in the case of obtaining a tomographic image of the ZX plane shown in FIG. 7(a), it is only required that the field be uniform in the disk shaped domain. In the actual case, thickness is not zero and the slicing thickness is different in accordance with the pulse sequence. Such adjustment can be accomplished in such a way that when distribution of the main magnetic field (static field) is measured preliminarily, the currents to be applied to the shim coils can be calculated from such distribution. The values of current to be applied to the shim coils, obtained from such calculations, are stored prior to operation, in the memory $M_1$ in computer $C_1$.

As examples of imaging domains the various cases shown in FIGS. 7(b)–7(f), can be considered. However, it is apparent from the subject matter of the invention, that the domain of a solid shown in FIGS. 7(a)–7(f) is further narrower than the domain to be unified by the apparatus of the prior art.

The above description is based on the presumption that distribution of field of the main magnetic static field can be accurately obtained by measurement. However, even if such measurement cannot be accurately obtained, the values of currents to be applied to the shim coils can be set as described below.

A phantom (not shown) of such as size as to correspond to the domain for which uniformity is desired to be obtained, is placed in a cylindrical part (i.e. with coils 1) of FIG. 1. This phantom is, for example, a tank filled with water. Next, this phantom as a whole is excited by the RF pulse in order to obtain the NMR signal. The spectrum of this NMR signal has a single frequency so long as the field is uniform. On the other hand, if the field is not unified, the spectrum may spread and a value of current applied to the shim coil is adjusted so that the width of the spectrum is minimized. The values of currents to be applied to the shim coils are stored in memory $M_1$, and such values are used during the operation Thus, optimum uniformity of field can be obtained in the predetermined imaging domain, as described above.

According to the invention, as described above, uniformity of only that domain required for imaging is necessary to be controlled. Thus it is no longer necessary to compensate the main magnetic field to attain uniformity of the magnetic field for the entire predetermined domain as required in the prior art. Accordingly, a static field coil can be manufactured easily and without the priorly required accuracy of design, thus, reducing costs. Also, maintenance costs are reduced since fine adjustments need not be constantly made as required in the prior art. Thus, the invention enhances practical use of NMR imaging apparatus.

Moreover, since uniformity of only the part of the domain is required to be controlled as to magnetic field applied, uniformity is more enhanced than in the prior art when imaging such narrow domain, and high quality images are produced by the invention.

The foregoing description is illustrative of the principles of the invention. Nmerous modifications and extensions thereof would be apparent to the worker skilled in the art. All such modifications and extensions are to be considered to be within the spirit and scope of the invention.

What is claimed is:

1. An NMR imaging apparatus wherein a specimen is placed in a magnetic field and a particular atomic nucleus distribution and the like within said specimen is detected by use of nuclear magnetic resonance, said apparatus comprising:

a static magnetic field coil for generating a static magnetic field;

a plurality of shim coils for providing compensation to the distribution of magnetic field produced by said static magnetic field coil;

a power supply for supplying power to respective ones of said plurality of shim coils;

memory means for storing previous to operation of said apparatus predetermined values of currents to be applied to respective ones of said plurality of shim coils to produce sufficient uniformity of static magnetic field after comensation at a predetermined imaging domain, and for storing present operational values of currents to be applied to said shim coils; and computer means responsive to data defining a predetermined imaging domain for selecting suitable values of currents from said memory means and causing said selected suitable values of currents to be applied to the shim coils thereby to cause said shim coils to provide compensation to said static magnetic field and produce said uniformity of distribution of magnetic field at said predetermined imaging domain.

2. The apparatus of claim 1, wherein said predetermined imaging domain comprises only a sliced part of said specimen being examined.

3. The apparatus of claim 1, wherein said computer calculates said values of currents to be applied to said shim coils based on measurements of a magnetic field produced by said static magnetic field coil and an ideal field required to produce a uniform distribution at said predetermined imaging domain.

4. The apparatus of claim 1, wherein said computer places in said memory values of currents to be applied to said shim coils to provide uniform distribution of said magnetic field based on an ideal test specimen provided in the apparatus.

* * * * *